United States Patent [19]

Uemura

[11] Patent Number: 4,587,431

[45] Date of Patent: May 6, 1986

[54] SPECIMEN MANIPULATING MECHANISM FOR CHARGED-PARTICLE BEAM INSTRUMENT

[75] Inventor: Eisuke Uemura, Akishimashi, Japan

[73] Assignee: Jeol Ltd., Tokyo, Japan

[21] Appl. No.: 601,652

[22] Filed: Apr. 18, 1984

[30] Foreign Application Priority Data

Apr. 22, 1983 [JP] Japan .................................. 58-71105
Apr. 22, 1983 [JP] Japan .................................. 58-71107

[51] Int. Cl.⁴ ............................................. G21K 5/10
[52] U.S. Cl. .................................. 250/442.1; 250/440.1
[58] Field of Search .......................... 250/440.1, 442.1; 269/50, 51, 52

[56] References Cited

U.S. PATENT DOCUMENTS 3,629,577 12/1971 Weber et al. ...................... 250/442.1
4,058,731 11/1977 Müller et al. ...................... 250/440.1

*Primary Examiner*—Bruce C. Anderson

*Attorney, Agent, or Firm*—Webb, Burden, Robinson & Webb

[57] ABSTRACT

A tilt stage that tilts about Y axis perpendicular to the optical axis of an electron beam which is called "the Z axis" herein is mounted to the front cover of a specimen chamber. A Z-axis stage capable of moving in the direction of Z axis and an X-axis stage capable of moving in the direction of X axis perpendicular to Y and Z axes are mounted on the tilt stage. A specimen holder for holding a specimen can be located at any desired position relative to the electron beam by the movements of these stages. Two driving shafts are disposed concentrically about the Y axis, i.e., their common axis. Driving mechanisms for independently driving the driving shafts along the Y axis are mounted to the front cover of the specimen chamber. The movements of the driving shafts are transmitted to the Z-axis stage and the X-axis stage via two levers whose pivots are supported on the tilt stage.

15 Claims, 6 Drawing Figures

SPECIMEN MANIPULATING MECHANISM FOR CHARGED-PARTICLE BEAM INSTRUMENT

DESCRIPTION

BACKGROUND OF THE INVENTION

The present invention relates to a specimen manipulating mechanism effectively used in a charged-particle beam instrument, such as Auger electron spectrometer or ion scanning microscope, that requires an ultrahigh vacuum to examine the surface of a specimen.

A conventional charged-particle beam instrument such as a scanning electron microscope has a specimen manipulating mechanism in its specimen chamber as shown schematically in FIG. 1. This manipulating mechanism is comprised of a mechanism for translating a specimen in the direction of Z axis coincident with the optical axis of the electron beam and also in the directions of the X and Y axes perpendicular to the Z axis, a mechanism for rotating the specimen about the Z axis, and a mechanism for tilting the specimen with respect to the X or Y axis. Referring specifically to FIG. 1, the specimen chamber of the scanning electron microscope is indicated by reference numeral 1. An electron-optical column 2 including objective lenses is mounted on the chamber that has a front cover or wall 3 to which a specimen tilt stage 4 is held so as to be rotatable about the Y axis. A toothed wheel 5 is secured to the tilt stage, and is in mesh with a toothed wheel 6 that is connected via a shaft 7 to a knob 8 disposed on the atmospheric side of the front cover. Since rotation of the knob 8 turns the stage 4 about the Y axis, the specimen can be tilted at any desired angle. A Y-axis stage 10 for movement along the Y axis, an X-axis stage 11 for movement about the X axis, and a rotary stage 12 are stacked on the tilt stage 4. A specimen holder 14 that holds a specimen 13 is inserted into the rotary stage. A plurality of balls are placed between the tilt stage 4 and the Y-axis stage 10 and also between the Y-axis stage 10 and the X-axis stage 11 to make the movement of each stage smooth. The shaft 15 of the rotary stage extends downwardly through the translational stages 10 and 11. A bevel gear 16 is securely fixed to the lower end of the shaft 15, and meshes with a bevel gear 17 which is connected via a universal joint 18 and a shaft 19 to a knob 20 mounted to the front cover 3. The rotating shaft 15 takes the form of a hollow tubing, into which a shaft 21 for vertically moving the specimen is inserted. The lower end of the shaft 21 bears on a lever 22 which, when rotated, acts to move the specimen holder 14 vertically. The lever 22 is connected to a knob 26 via a threaded rod 23, a universal joint 24, and a shaft 25. A knob 27 is connected to the Y-axis stage 10 via a shaft 28, a universal joint 29, and a threaded rod 30 such that the rotation of the knob 27 is transmitted to the stage 10 as a translational motion. Indicated by reference numeral 9 is a knob for manipulating the X-axis stage. (The linkage between knob 9 and the X-axis stage is not shown in the drawing but can be understood as like the linkage between knob 27 and the Y-axis stage.)

In the conventional apparatus constructed as described above, if the knobs 9 and 27 are rotated, the specimen 13 is translated in the directions of the X and Y axes in a plane perpendicular to the optical axis Z. If the knob 26 is rotated, the specimen is shifted in the direction of the optical axis. If the knob 20 is rotated, the specimen rotates about the axis of the shaft 16. If the knob 8 is turned, the tilt stage 4 is angularly moved thus to rotate all the stages about the Y axis, whereby the sample is tilted to a desired angular position. Accordingly, this configuration permits the specimen to be moved to any desired position or tilted in any spatial attitude relative to the electron beam, thus enabling observation of the specimen from any desired position or angle. However, if the specimen is inclined at a large angle, the four driving shafts swing and come close to one another, imposing limitations on the amounts of the movements of the shafts and on the tiltable range of angle. Another difficulty arises from many O rings that are used as hermetic seals to transmit the rotary motions of the knobs 8, 27, 26, and 9, which are installed on the front cover for moving the specimen, to the shafts for driving the stages in the specimen chamber, as can be seen from the figure. That is, these rings release a large quantity of gas and hence it is impossible to maintain the degree of vacuum in the specimen chamber 1 at a sufficiently high value. Another difficulty comes from the numerous threaded rods or the like which are used to transmit the rotations of the shafts in the specimen chamber to the stages. In particular, these feed rods produce large sliding friction and so a lubricant is often employed to minimize this friction. Unfortunately, this lubricant also discharges a large quantity of gas, leading to a deterioration in the degree of vacuum in the specimen chamber 1.

It is known that the analysis of the surface of a specimen can be effected by an Auger electron spectrometer or photoelectron spectrometer. The charged-particle beam instrument of this kind needs a specimen manipulating mechanism for translating or tilting the specimen in any desired manner to make an analysis of a desired region of it. Further, the instrument requires that the space, or the specimen chamber in which a specimen is placed, be maintained at a quite low pressure in order to keep the surface clean for enhancing the accuracy of the analysis. For this reason, a specimen manipulating mechanism as shown in FIG. 1 cannot be used for the instrument necessitating a high vacuum in this way. In addition, the use of a number of O rings as hermetic seals is undesirable for the bakeout of the members mounted in the specimen chamber. Accordingly, it may be suggested to use a rotary motion feedthrough mechanism making use of a metal bellows for an ultrahigh vacuum environment instead of the O rings that serve as the hermetic seals for the rotary members, in order to keep the interior of the chamber in an ultrahigh vacuum condition, but the rotary motion feedthrough mechanism is unable to transmit large torque and is expensive. Further, it occupies a relatively large space. Therefore, if such rotary motion feedthrough mechanisms are used in quantities, the whole specimen manipulating mechanism becomes bulky. Another difficulty is that special lubricants which are suited for ultrahigh vacuum and can be used for the threaded feed rods in general require periodic maintenance, and therefore use of such feed rods in quantities in an instrument requiring an ultrahigh vacuum is undesirable. Consequently, the prior art specimen manipulating mechanism for an Auger electron spectrometer or the like has incorporated a specimen manipulating mechanism which is capable of giving only two movements in the directions of X and Y axes to the specimen unlike the apparatus of FIG. 1 which gives as many as five movements.

OBJECTS OF THE INVENTION

It is the main object of the present invention to provide a specimen manipulating mechanism that can tilt a specimen over a wide angle.

It is another object of the invention to provide a specimen manipulating mechanism which is simple in structure but is able to move a specimen in any desired direction smoothly.

It is a further object of the invention to provide a specimen manipulating mechanism permitting bakeout of the members mounted within the specimen chamber. The bakeout is needed to prevent the adsorbed gas from being released later, thus maintaining the ultrahigh vacuum of the chamber.

SUMMARY OF THE INVENTION

The foregoing and additional objects are attained in accordance with the teachings of the present invention by providing a specimen manipulating mechanism which is for use in a charged-particle beam instrument and is mounted in the specimen chamber. The mechanism has a tilt stage capable of tilting about a Y axis perpendicular to the optical axis Z of the charged-particle beam. It has at least two stages mounted on the tilt stage and capable of moving a specimen holder in at least two directions including the direction of the Y axis and the direction of either X or Z axis perpendicular to the Y axis. The manipulating mechanism further includes: two or more rodlike or tubelike shaft means disposed about the Y axis; driving mechanisms for moving the shaft means independently in the direction of the Y axis; and two or more lever means placed among one end of the shaft means and the stages and carried on the tilt stage to transmit the movements of the shaft means caused by the driving mechanisms to the stages.

DESCRIPTION OF THE PREFERRED EMBODIMENTS

Figure 1:
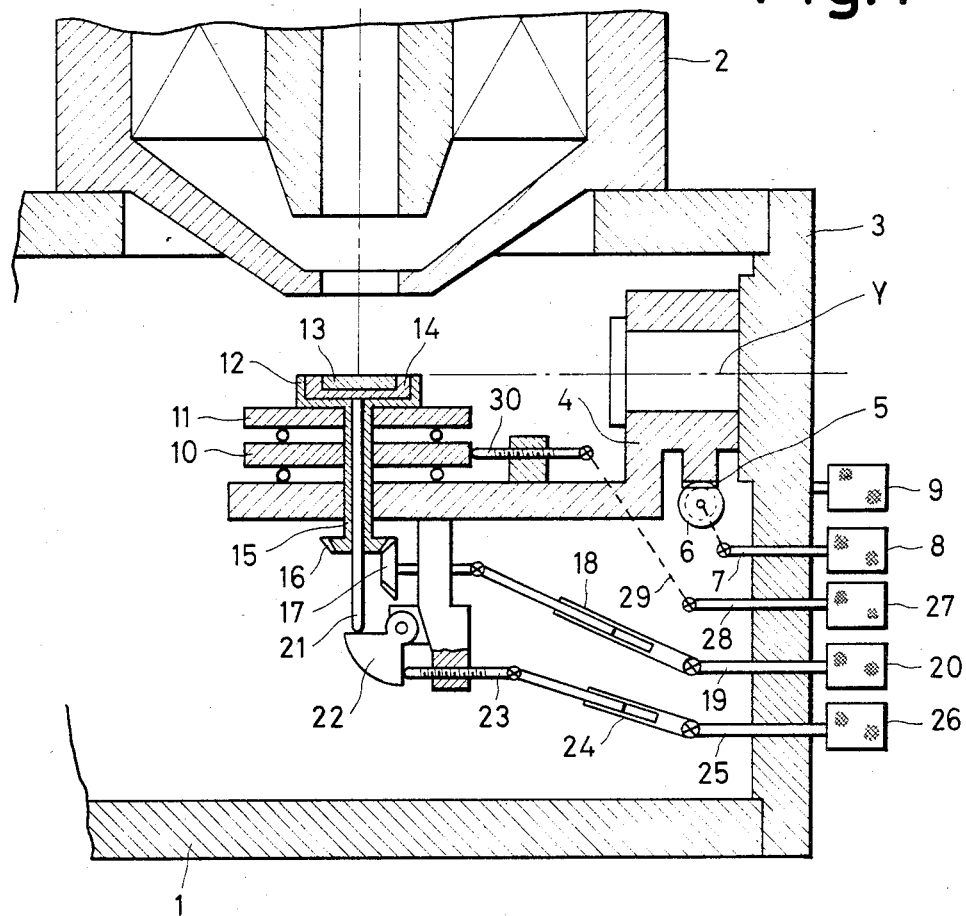
FIG. 1 is a schematic front elevation in section of a specimen manipulating mechanism used in a conventional scanning electron microscope according to the prior art.
Figure 2:
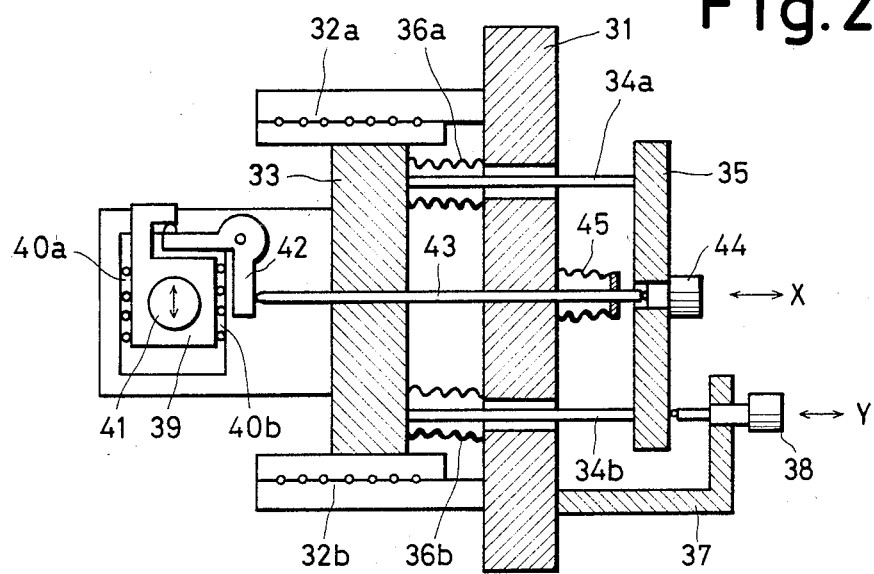
FIG. 2 is a schematic representation for illustrating the operation of an apparatus shown in FIGS. 3 and 4.
Figure 3:
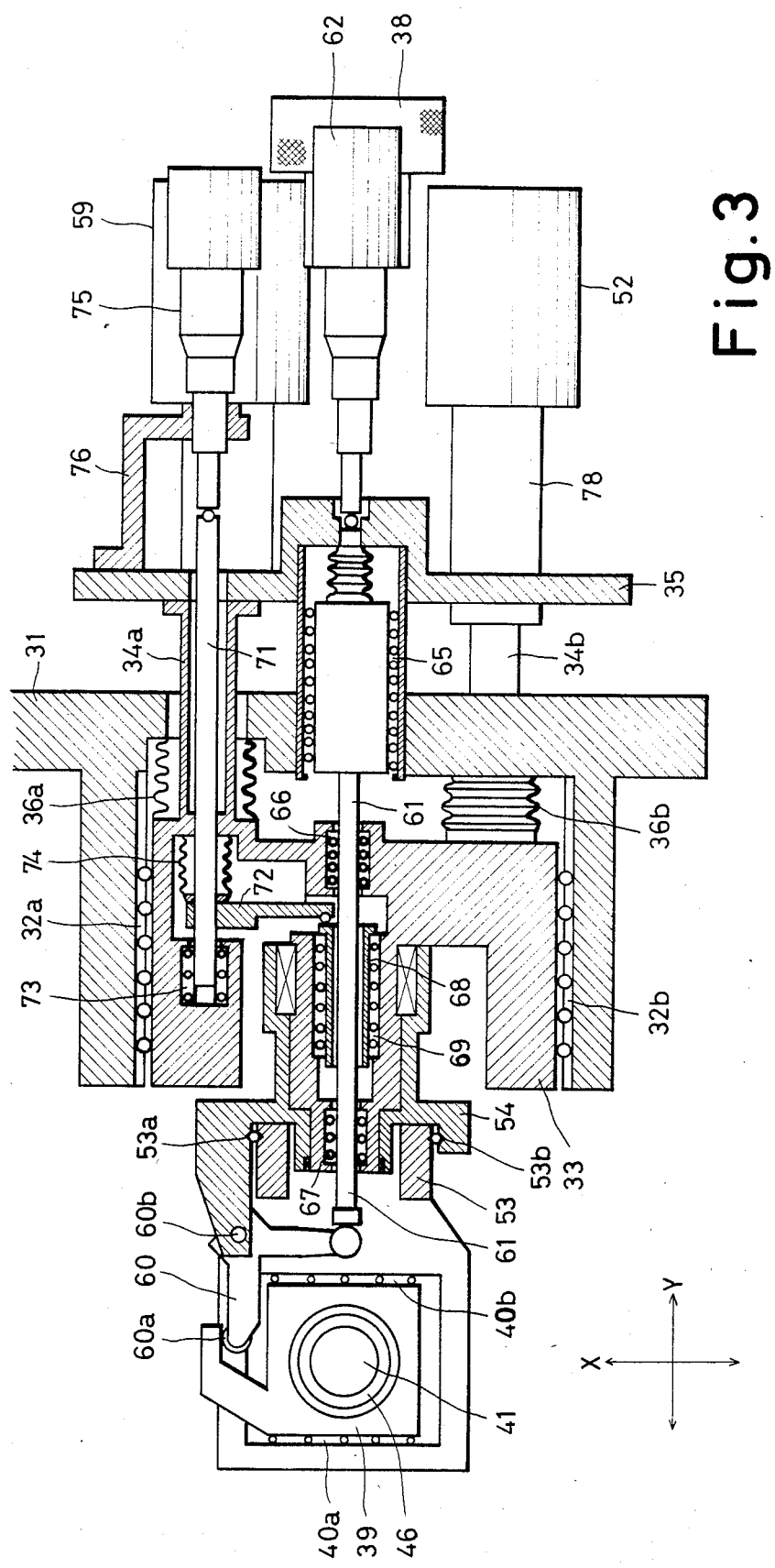
FIG. 3 is a plan view in section of an apparatus according to the present invention.
Figure 4:
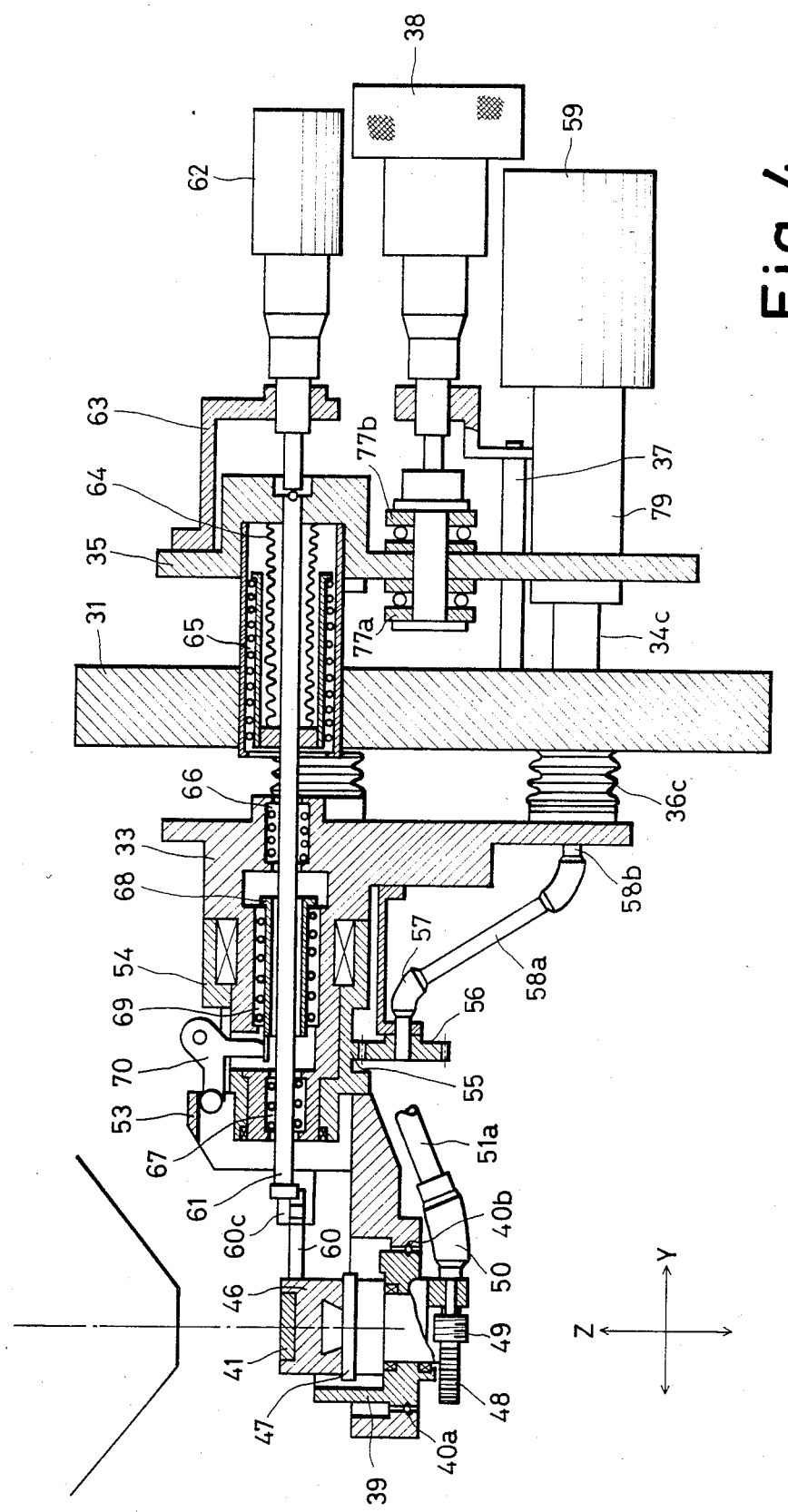
FIG. 4 is a longitudinal cross section of the apparatus shown in FIG. 3.

Referring to FIG. 2, some of the operations of the novel device shown in FIGS. 3 and 4 are now schematically described. Indicated by reference numeral 31 is the front cover 3 of the specimen chamber shown in FIG. 1. Two straight guides 32a and 32b are mounted parallel to the Y axis on the vacuum side of the cover 31, i.e., on the left side of FIG. 2, and hold a Y-axis stage 33 in such a way that the stage can move in the direction of the Y axis. Each of the guides 32a and 32b is provided with a V-shaped groove in which a plurality of balls or rollers are placed such that they are in rolling contact with the stage 33. (The balls are shown most schematically without reference to the grooves which, of course, must be parallel to the direction of the Y axis.) Protruding vertically from the Y-axis stage 33 are three or more posts 34a, 34b, and so on, which extend through the front cover 31 into the atmosphere and are firmly secured to a Y-axis base 35. The posts 34a and 34b are surrounded by metal bellows 36a and 36b, respectively, both ends of each of which are fixedly secured to the front cover 31 and to the Y-axis stage 33 in an airtight manner. Fixed to the atmospheric side of the front cover 31 is a frame 37 that supports the body of a mcrometer head 38 for driving in the direction of the Y axis. The front end of the head 38 bears on the Y-axis base 35. A specimen 41 is carried on an X-axis stage 39 which is held to the Y-axis stage 33 via guide members 40a and 40b so as to be movable along X axis perpendicular to the Z and Y axes. An L-shaped lever 42 has one end which is in contact with the X-axis stage 39, the other being in contact with a driving shaft 43. The opposite end of the shaft 43 extends through the front cover 31 into the atmosphere, and is in contact with a micrometer head 44 which is used for driving along the X axis, the body of the head 44 being mounted to the Y-axis base 35. A metal bellows 45 is disposed to surround a part of the shaft 43. The opposite ends of the bellows 45 are securely fixed to the front cover 31 and to the shaft 43, respectively, in an airtight fashion.

In the apparatus constructed as described above, the specimen is moved in the direction of the Y axis by rotating the knob of the micrometer head 38. Specifically, the rotation of the micrometer head 38 moves the base 35 along the Y axis. This movement is then transmitted to the Y-axis stage 33 via the posts 34a, 34b, and so on, thus shifting the stage along the Y axis. If the knob of the micrometer head 44 is rotated, the movement is transmitted to the lever 42 via the shaft 43, rotating the lever. As a result, the X-axis stage 39 that is in contact with the opposite end of the lever is conveyed along the X axis. The movement of the Y-axis stage 33 as well as the movement of the shaft along the X axis is made while the vacuum is maintained by the metal bellows. Thus, the specimen 41 can be moved at discretion in the X-Y plane perpendicular to the optical axis by arbitrarily rotating the knobs of the micrometer heads 38 and 44.

FIGS. 3 and 4 are a plan view in section and a longitudinal cross section, respectively, of the apparatus according to the invention. This apparatus includes a translational mechanism in the direction of the Z axis, a tilt mechanism, and a rotary mechanism, in addition to the mechanisms for translations in the directions of the X and Y axes already described in connection with FIG. 2. It is to be noted that the components indicated by the same reference numerals function similarly throughout FIGS. 2–4. Referring to FIGS. 3 and 4, a specimen 41 is held on a specimen holder 46 which is mounted on a rotary stage 47. This rotary stage extends downward through the X-axis stage 39 so as to be rotatable relative to the stage 39. Securely fixed to the lower end of the rotary stage is a toothed wheel 48 which is in mesh with a worm 49 journaled on the X-axis stage 39. The worm 49 is connected to a rotary motion feedthrough mechanism 78 via a flexible shaft 50, shafts 51a, 51b (not shown) and other parts, the mechanism 78 being affixed to the Y-axis base 35. As such, the rotation of a rotary knob 52 disposed on the atmospheric side is transmitted to the worm 49. The shaft 51b (not shown) is surrounded and hermetically sealed by the tubelike post 34b and the metal bellows 36b such that the distance between the shaft and the front cover 31 can be varied. The rotary motion feedthrough mechanism 78 uses bellows or the like as its hermetic seal members rather than O rings, and acts to transmit rotation. A vertical movement stage 53 which can move along the Z axis is held to a tilt stage 54 via straight guides 53a and 53b each of which is formed with a V-shaped groove in which balls are inserted. The tilt stage 54 is secured to the Y-axis stage 33 via ball bearings in such a way that it can angularly move relative to the stage. The tilt stage 54 is partially provided with teeth 55 which are in mesh with a toothed wheel 56 journaled on the Y-axis stage 33. The wheel 56 is connected to a rotary motion feedthrough mechanism 79 via a flexible shaft 57, shafts 58a, 58b, and other members, the mechanisms 79 being fixed to the Y-axis base 35. The rotation of a knob 59 which is mounted on the atmospheric side for tilting operation is transmitted to the teeth 55. The shaft 58b is surrounded and hermetically sealed by the tubelike post 34c and the metal bellows 36c in such a way that the distance between the shaft and the front cover 31 can be altered. An L-shaped lever 60 is used for movement along the X axis, and has a pivot 60b supported to the tilt stage 54. One end of the lever 60 is in contact with the X-axis stage 39, while the other end is in contact with a driving shaft 61. This shaft 61 extends through the Y-axis stage 33 into the Y-axis base 35, and can slide in the stage 33. The end of the shaft 61 which can move relative to the base 35 is in contact with the front end of a micrometer head 62 for movement along the X axis. The body of the head 62 is mounted to the Y-axis base by means of a frame 63. Rotation of the knob of the micrometer head 62 moves only the front end portion axially of the shaft 61 forward or backward. A metal bellows 64 is fixed between the driving shaft 61 and the Y-axis base 35 in an airtight manner. A coiled spring 65 is disposed on the outer periphery of the bellows to urge the driving shaft 61 into contact with the front end of the micrometer head 62, and the spring is fixedly secured to the front cover 31. The driving shaft 61 is guided by straight guides 66 and 67 which comprise a number of balls placed on the Y-axis stage 33 such that the shaft 61 can smoothly move only axially thereof. A tubelike shaft 68 is fitly mounted on the shaft which extends through the Y-axis stage 33 for driving along the X axis, in order to form a concentric shaft. The shaft 68 is held to the Y-axis stage 33 via a straight guide 69 having a number of balls in such a manner that the shaft 68 can move axially of the shaft 61 independently of the shaft 61. The left end of the tubelike shaft 68 which is nearer to the optical axis of the electron beam than the right end is in contact with one end of an L-shaped lever 70, the other end of the lever 70 being in contact with the vertical movement stage 53. The pivot of the lever 70 is supported to the tilt stage 54. The right end of the shaft 68 is pressed against a lever 72 which is securely fixed to a driving shaft 71 for movement along the Z axis. The shaft 71 is carried on a straight guide 73 so that it may make a sliding movement relative to the Y-axis stage 33. A metal bellows 74 is fixed between the shaft 71 and the Y-axis stage in an airtight manner. The shaft 71 extends through the post 34a (see FIGS. 2 and 3) into the atmosphere and protrudes from the Y-axis base 35. The front end of a micrometer head 75 for movement along the Z axis bears on this protrusion. The body of this micrometer head is firmly secured to the Y-axis base 35 via a frame 76. The front end of the micrometer head 38 for movement along the Y axis is coupled to the Y-axis base 35 through the intermediary of bearings 77a and 77b.

In the structure constructed as described just above, if the knob of the micrometer head 38 for movement along the Y axis is rotated, the Y-axis base 35 is moved along the Y axis, causing the posts 34a, 34b, 34c to move the Y-axis stage 33 in the same direction. Then this movement is transmitted to the vertical movement stage 53, the X-axis stage 39, and the rotary stage 47 to move the specimen 41 along the Y axis. Under this condition, if the knob of the micrometer head 62 for movement along the X axis is rotated, this movement is transmitted to the X-axis stage 39 via the driving shaft 61 and the lever 60 thus to move the stage 39 in the direction of the X axis. The movement along the Y axis and this movement along the X axis permit any desired movement of the specimen in the plane perpendicular to the optical axis Z of the electron beam. Then, if the knob of the micrometer head 75 for movement along the Z axis is rotated, this movement is imparted to the vertical stage 53 via the shaft 71, the lever 72, the tubelike shaft 68, and the lever 70, so that the stage 53 is moved along the Z axis. Thus, the position is adjusted in the direction of the optical axis of the electron beam according to the desire of the operator.

If the knob 52 for rotary movement is turned, this movement is given to the rotary stage 47 via the rotary motion feedthrough mechanism 78, the rotary shaft 51b (not shown) in the post, the shaft 51a, the flexible shaft 50, the worm 49, and the toothed wheel 48. Accordingly, the rotary stage 47 is rotated about its axis and hence the specimen 41 can be rotated about the optical axis according to the operator's desire.

If the knob 59 for tilt is rotated, the rotary motion is transmitted to the tilt stage 54 via the rotary motion feedthrough mechanism 79, the shafts 58b, 58a, the flexible shaft 57, and the toothed wheel 56, and the teeth 55, and therefore the stage 54 is rotated around the axis of the shaft 61 for driving along the X axis. The result is that the specimen 41 is tilted about the Y axis.

Figure 5:
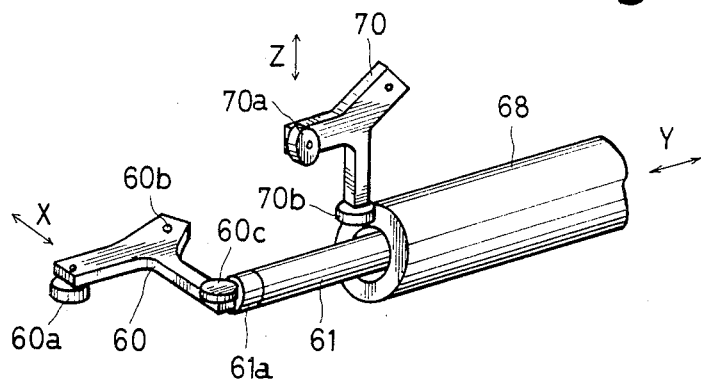
FIG. 5 is a perspective view of the main members for illustrating the operation of the apparatus shown in FIGS. 3 and 4.

FIG. 5 is an enlarged perspective view of the aforementioned two shafts 61 and 68 and of the two levers 60 and 70, for showing the manner in which they make contact with one another. Rotary members 70a and 70b are mounted via bearings to the portions of the lever 70 at which the lever engages with the Z-axis stage and the shaft 68, respectively. Rotary members 60a and 60c are mounted via bearings to the portions of the lever 60 at which it makes contact with the X-axis stage for movement along the X axis and the shaft 61, respectively. Another rotary member 61a is mounted to the front end of the shaft 60 via a thrust bearing.

In the structure as described above, when the tilt stage 54 is tilted, the levers 70 and 60 supported on the stage 54 rotate smoothly about the Y axis, because the aforementioned rotary members 60c, 70b, and 61a are placed among these levers and shafts, producing only small rolling resistance. Also, when the shafts 61 and 68 are moved along the Y axis to shift the Z-axis and X-axis stages via the members 60 and 70, small rolling resistance may be caused by the rotary members 70a, 60a, 61a, and so on, but the moving operations can be smoothly effected because a threaded feed rod producing large sliding friction is not used as a means for converting a rotary motion into a transitional motion as encountered with the prior art apparatus.

As can be understood from the foregoing description, the present invention permits the tilt stage to be inclined more smoothly than conventional. Further, there arises no possibility that the driving shafts for driving the X-axis stage, the Z axis stage, and so on mounted on the tilt stage come close to each other, unlike the prior art apparatus. Consequently, it is possible to tilt the tilt stage over a wider range of angle than conventional.

Figure 6:
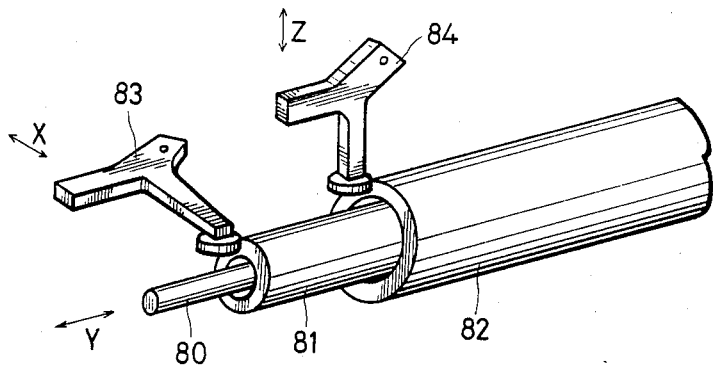
FIG. 6 is a perspective view of the main portions of another apparatus according to the invention.

FIG. 6 is a perspective view of the main portions of another apparatus according to the present invention. In this embodiment, the tilt stage is mounted to the front cover of the specimen chamber so as to be tiltable about the Y axis. The Y-axis stage, the X-axis stage, and the Z-axis stage (all of which are not shown) are placed on the tilt stage. A rodlike shaft 80 and the tubelike shafts 81, 82 are disposed concentrically about the Y axis in such a way that they can move independently along the Y axis. The movement of the shaft 80 is directly transmitted to the Y-axis stage, but the movements of the shafts 81 and 82 are transmitted to L-shaped levers 83 and 84, respectively, secured to the tilt stage. Therefore, the movements along the Y axis are turned into the movements along the X and Z axes, respectively. In this way, in the novel apparatus, the movements along the X, Y, and Z axes are effected by their respective shafts which are disposed about the common axis, i.e., the tilt axis of the tilt stage. Consequently, the driving shafts do not come close to each other, thus permitting tilts of larger angles.

While the invention has been particularly shown and described with reference to preferred embodiments thereof, it will be understood by those skilled in the art that various changes and modifications may be made without departing from the spirit and scope of the invention of the appended claims. For example, in the above examples, the operations of the stages are manually effected, but the invention may equally be applied to a specimen manipulating apparatus where the knobs of micrometer heads and driving knobs are driven by stepper motors. Further, it is not essential to the invention to incorporate all the functions regarding the movements along the three mutually perpendicular directions and the rotation about the Z axis into an apparatus. As an example, the invention may be applied with equal utility to a simplified construction in which the mechanisms for movement along the Z axis and for rotation about the Z axis are omitted.

Having thus described the invention with the detail and particularity required by the Patent Laws, what is desired protected by Letters Patent is set forth in the following claims.

I claim:

1. A specimen manipulating mechanism adapted for use in a charged-particle beam instrument and mounted in the specimen chamber of the instrument, the manipulating mechanism being movable relative to three axes, said axes comprising a Z axis coincident with the optical axis of the charged particle beam and X and Y axes perpendicular to each other and to the Z axis, the mechanism having a tilt stage capable of tilting about the Y axis and at least two translating stages mounted on the tilt stage and capable of moving a specimen holder in at least two directions among three directions along the X, Y and Z axes, said specimen manipulating mechanism including:

two or more elongate means disposed concentrically about the Y axis;

driving mechanisms for moving the elongate means independently in the direction of the Y axis; and two or more lever means placed between the elongate means and the translating stages carried on the tilt stage to transmit the movements of the elongate means caused by the driving mechanisms to the stages.

2. A specimen manipulating mechanism as set forth in claim 1, wherein an X-axis stage, a Y-axis stage, and a Z-axis stage are mounted on the tilt stage for moving the specimen holder in the directions of the X, Y and Z axes, respectively, and wherein three elongate means transmit movement to the three stages via lever means.

3. A specimen manipulating mechanism as set forth in claim 1, wherein the tilt stage is mounted in the specimen chamber via a Y-axis stage, capable of moving in the direction of the Y axis, and wherein an X-axis stage and a Z-axis stage moving in the directions of the X and Z axes, respectively, are mounted on the tilt stage, the two or more elongate means being so designed as to transmit the movements thereof to the Z-axis stage and the X-axis stage via respective lever means.

4. A specimen manipulating mechanism adapted for use in a charged-particle beam instrument mounted in a specimen chamber, the manipulating mechanism being movable relative to three axes, said axes comprising a Z axis coincident with the optical axis of the charged particle beam and X and Y axes perpendicular to each other and the Z axis, said mechanism including a tilt stage capable of tilting about the Y axis, an X-axis stage and a Z-axis stage mounted on the tilt stage and capable of moving a specimen holder in the directions of X and Z axes, respectively, said specimen manipulating mechanism further including:

a Y-axis stage mounted in the specimen chamber supporting the tilt stage thereon, and being moved in the direction of the Y axis;

a Y-axis base fixedly secured to the Y-axis stage by a plurality of posts which extend through the wall of the specimen chamber, the base being disposed outside the specimen chamber;

a plurality of bellows keeping the airtightness between the posts and the wall of the specimen chamber;

two elongate means disposed concentrically about the Y axis;

driving mechanisms for moving the two elongate means independently in the direction of the Y axis; and two lever means placed between the two elongate means, the X-axis stage, and the Z-axis stage and supported on the tilt stage for transmitting the movements of the elongate means caused by the driving mechanisms.

5. The specimen manipulating mechanism as set forth in claim 1 wherein the elongate means comprises a rodlike shaft and a tubelike shaft telescoped thereover and a first lever being pivotally mounted to the tilt stage having one end thereof that bears upon the end of the rodlike shaft irrespective of the tilt of the tilt stage and a second lever being pivotally mounted to the tilt stage having one end thereof that bears upon the end of the tubelike shaft irrespective of the tilt of the tilt stage.

6. The specimen manipulating mechanism as set forth in claim 5 wherein a second tubelike shaft is telescoped over the first tubelike shaft and means mounted to the tilt stage that bears upon the second tubelike shaft irrespective of the tilt of the tilt stage.

7. The specimen manipulating mechanism as set forth in claim 5 wherein one of said first and second levers actuates an X-axis stage.

8. The specimen manipulating mechanism as set forth in claim 6 wherein one of said first, second and third levers actuates an X-axis stage.

9. The specimen manipulating mechanism as set forth in claim 5 wherein one of said first and second levers actuates a Y-axis stage relative to said tilt stage.

10. The specimen manipulating mechanism as set forth in claim 6 wherein one of said first, second and third levers actuates a Y-axis stage relative to said tilt stage.

11. The specimen manipulating mechanism as set forth in claim 5 wherein one of said first and second levers actuates a Z-axis stage relative to said tilt stage.

12. The specimen manipulating mechanism as set forth in claim 6 wherein one of said first, second and third levers actuates a Z-axis stage relative to said tilt stage.

13. The specimen manipulating mechanism as set forth in claim 4 wherein the elongate means comprises a rodlike shaft and a tubelike shaft telescoped thereover and a first lever being pivotally mounted to the tilt stage having one end thereof that bears upon an end of the rodlike shaft irrespective of the tilt of the tilt stage and a second lever being pivotally mounted to the tilt stage having one end thereof that always bears upon the tubelike shaft irrespective of the tilt of the tilt stage.

14. The specimen manipulating mechanism as set forth in claim 13 wherein one of said first and second levers actuates an X-axis stage relative to said tilt stage.

15. The specimen manipulating mechanisms as set forth in claim 13 wherein one of said first and second levers actuates a Z-axis stage relative to said tilt stage.

* * * * *

UNITED STATES PATENT AND TRADEMARK OFFICE
CERTIFICATE OF CORRECTION

PATENT NO. : 4,587,431

DATED : May 6, 1986

INVENTOR(S) : Eisuke Uemura

It is certified that error appears in the above-identified patent and that said Letters Patent is hereby corrected as shown below:

Column 4 Line 12 "mcrometer" should read —micrometer—.

Column 6 Line 67 "transitional" should read —translational—.

Signed and Sealed this

Fifth Day of August 1986

[SEAL]

Attest:

DONALD J. QUIGG

Attesting Officer

Commissioner of Patents and Trademarks